US010170645B2

United States Patent
Song et al.

(10) Patent No.: US 10,170,645 B2
(45) Date of Patent: Jan. 1, 2019

(54) ORGANIC VEHICLE FOR ELECTROCONDUCTIVE PASTE

(71) Applicant: Heraeus Precious Metals North America Conshohocken LLC, West Conshohocken, PA (US)

(72) Inventors: Lixin Song, King of Prussia, PA (US); Cuiwen Guo, North Wales, PA (US); Chilong Chen, Singapore (SG); Weiming Zhang, Blue Bell, PA (US)

(*) Notice: Subject to any disclaimer, the term of this patent is extended or adjusted under 35 U.S.C. 154(b) by 119 days.

(21) Appl. No.: 13/667,293

(22) Filed: Nov. 2, 2012

(65) Prior Publication Data
US 2013/0112261 A1 May 9, 2013

Related U.S. Application Data

(60) Provisional application No. 61/555,858, filed on Nov. 4, 2011.

(51) Int. Cl.
*H01L 31/0224* (2006.01)
*H01B 1/22* (2006.01)

(52) U.S. Cl.
CPC ....... *H01L 31/022425* (2013.01); *H01B 1/22* (2013.01); *Y02E 10/50* (2013.01)

(58) Field of Classification Search
CPC .................... H01L 31/022425–31/022458
See application file for complete search history.

(56) References Cited

U.S. PATENT DOCUMENTS

| 5,242,623 A * | 9/1993 | Morrison, Jr. ............ C08K 3/08 106/1.13 |
| 7,569,247 B2 | 8/2009 | Satou et al. |
| 2001/0006451 A1* | 7/2001 | Miyazaki ................ B32B 18/00 361/321.2 |
| 2005/0238804 A1 | 10/2005 | Garbar et al. |
| 2007/0144577 A1* | 6/2007 | Rubin ............ H01L 31/022433 136/256 |
| 2008/0145633 A1* | 6/2008 | Kodas .................. B22F 1/0018 428/220 |

(Continued)

FOREIGN PATENT DOCUMENTS

| CN | 102067323 A | 5/2011 |
| EP | 0 452 118 A1 | 10/1991 |

(Continued)

OTHER PUBLICATIONS

"Product Guide L-G 1: Paint Additives", BYK, Feb. 2009.*

*Primary Examiner* — Eric R Smith
(74) *Attorney, Agent, or Firm* — Blank Rome LLP

(57) ABSTRACT

An organic vehicle used in the manufacture of electroconductive silver paste. The organic vehicle comprises an organic binder, a surfactant, and an organic solvent. The preferred embodiment of the invention utilizes at least one of PVP, PMMA, or PVB as the organic binder, allowing for high compatibility with the metallic particles and resulting in an electroconductive paste with low viscosity for fine line printability. Another aspect of the invention relates to an electroconductive paste composition. The preferred embodiment utilizes metallic particles, glass frit, and an organic vehicle comprising a binder, namely at least one of PVP, PMMA, or PVB, a surfactant, and an organic solvent.

7 Claims, 1 Drawing Sheet

(56) References Cited

U.S. PATENT DOCUMENTS

| | | |
|---|---|---|
| 2009/0189126 A1* | 7/2009 | Prunchak ............... 252/519.51 |
| 2010/0037942 A1* | 2/2010 | Borland et al. ............... 136/255 |
| 2010/0163101 A1* | 7/2010 | Kumar ................... H01B 1/22 |
| | | 136/256 |
| 2011/0151614 A1* | 6/2011 | Lochtman et al. ............. 438/98 |
| 2011/0232746 A1 | 9/2011 | Carroll et al. |

FOREIGN PATENT DOCUMENTS

| | | | |
|---|---|---|---|
| EP | 0630031 A2 * | 12/1994 | ....... H01C 17/06593 |
| EP | 1 713 093 B1 | 9/2008 | |
| EP | 2 295 507 A1 | 3/2011 | |
| JP | H04213373 A | 8/1992 | |
| JP | H0718148 A | 1/1995 | |
| JP | 2008513565 A | 5/2008 | |
| JP | 2010500475 A | 1/2010 | |
| JP | 2011524646 A | 9/2011 | |
| KR | 2008 0112624 A | 12/2008 | |
| KR | 2008 0114202 A | 12/2008 | |
| KR | 2011 0117390 A | 10/2011 | |
| WO | 2006030286 A1 | 3/2006 | |
| WO | WO 2009153192 A2 * | 12/2009 | |
| WO | 2011/028058 A2 | 3/2011 | |

* cited by examiner

ORGANIC VEHICLE FOR ELECTROCONDUCTIVE PASTE

FIELD OF THE INVENTION

This invention relates to electroconductive pastes as utilized in solar panel technology. Specifically, in one aspect, the invention relates to an organic vehicle used in the formulation of an electroconductive paste. Another aspect of the invention relates to an electroconductive paste composition. Another aspect of the invention relates to a solar cell produced by applying an electroconductive paste comprised of metallic particles, glass frit, and an organic vehicle.

BACKGROUND OF THE INVENTION

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs. When light hits a solar cell, a fraction of the incident light is reflected by the surface and the remainder is transmitted into the solar cell. The photons of the transmitted light are absorbed by the solar cell, which is usually made of a semiconducting material such as silicon. The energy from the absorbed photons excites electrons of the semiconducting material from their atoms, generating electron-hole pairs. These electron-hole pairs are then separated by p-n junctions and collected by conductive electrodes which are applied on the solar cell surface.

The most common solar cells are those based on silicon, more particularly, a p-n junction made from silicon by applying an n-type diffusion layer onto a p-type silicon substrate, coupled with two electrical contact layers or electrodes. In a p-type semiconductor, dopant atoms are added to the semiconductor in order to increase the number of free charge carriers (positive holes). In the case of silicon, a trivalent atom is substituted into the crystal lattice. Essentially, the doping material takes away weakly bound outer electrons from the semiconductor atoms. One example of a p-type semiconductor is silicon with a boron or aluminum dopant. Solar cells can also be made from n-type semiconductors. In an n-type semiconductor, the dopant atoms provide extra electrons to the host substrate, creating an excess of negative electron charge carriers. Such doping atoms usually have one more valence electron than one type of the host atoms. The most common example is atomic substitution in group IV solids (silicon, germanium, tin), which contain four valence electrons, by group V elements (phosphorus, arsenic, antimony), which contain five loosely bound valence electrons. One example of an n-type semiconductor is silicon with a phosphorous dopant.

In order to minimize reflection of the sunlight by the solar cell, an antireflection coating (ARC), such as silicon nitride, silicon oxide, alumina oxide or titanium oxide, is applied to the n-type or p-type diffusion layer to increase the amount of light coupled into the solar cell. The ARC is typically non-conductive and may also passivate the surface of the silicon substrate.

Silicon solar cells typically have electroconductive pastes applied to both their front and back surfaces. As part of the metallization process, a rear contact is typically first applied to the silicon substrate, such as by screen printing a back side silver paste or silver/aluminum paste to form soldering pads. Next, an aluminum paste is applied to the entire back side of the substrate to form a back surface field (BSF), and the cell is then dried. Next, using a different type of electroconductive paste, a metal contact may be screen printed onto the front side antireflection layer to serve as a front electrode. This electrical contact layer on the face or front of the cell, where light enters, is typically present in a grid pattern made of "finger lines" and "bus bars," rather than a complete layer, because the metal grid materials are typically not transparent to light. The silicon substrate with printed front side and back side paste is then fired at a temperature of approximately 700-975° C. After firing, the front side paste etches through the antireflection layer, forms electrical contact between the metal grid and the semiconductor, and converts the metal pastes to metal electrodes. On the back side, the aluminum diffuses into the silicon substrate, acting as a dopant which creates the BSF. The resulting metallic electrodes allow electricity to flow to and from solar cells connected in a solar panel.

A description of a typical solar cell and the fabrication method thereof may be found, for example, in European Patent Application Publication No. 1 713 093.

To assemble a panel, multiple solar cells are connected in series and/or in parallel and the ends of the electrodes of the first cell and the last cell are preferably connected to output wiring. The solar cells are typically encapsulated in a transparent thermal plastic resin, such as silicon rubber or ethylene vinyl acetate. A transparent sheet of glass is placed on the front surface of the encapsulating transparent thermal plastic resin. A back protecting material, for example, a sheet of polyethylene terephthalate coated with a film of polyvinyl fluoride having good mechanical properties and good weather resistance, is placed under the encapsulating thermal plastic resin. These layered materials may be heated in an appropriate vacuum furnace to remove air, and then integrated into one body by heating and pressing. Furthermore, since solar cells are typically left in the open air for a long time, it is desirable to cover the circumference of the solar cell with a frame material consisting of aluminum or the like.

A typical electroconductive paste contains metallic particles, glass frit (glass particles), and an organic vehicle. These components must be carefully selected to take full advantage of the potential of the resulting solar cell. For example, it is necessary to maximize the contact between the metallic paste and silicon surface, and the metallic particles themselves, so that the charge carriers can flow through the interface and finger lines to the bus bars. The glass particles in the composition etch through the antireflection coating layer, helping to build contacts between the metal and the n+ type Si. On the other hand, the glass must not be so aggressive that it shunts the p-n junction after firing. Thus, minimizing contact resistance is desired with the p-n junction kept intact so as to achieve improved efficiency. Known compositions have high contact resistance due to the insulating effect of the glass in the interface of the metallic layer and silicon wafer, as well as other disadvantages such as high recombination in the contact area. Further, the composition of the organic vehicle can affect the potential of the resulting solar cell as well. The organic vehicle can affect the viscosity of the electroconductive paste, thus affecting its printability. It can also affect the properties of the printed lines, thereby affecting the overall efficiency of the solar cells produced. Accordingly, there is a need for an organic vehicle composition that optimizes the viscosity of an electroconductive paste.

SUMMARY OF THE INVENTION

The invention provides an organic vehicle for use in an electroconductive paste comprising a binder comprising at least one of polyvinylpyrrolidone (PVP), polymethylmethacrylate (PMMA), or polyvinyl butyral (PVB), a surfactant and an organic solvent. According to another embodiment, the organic vehicle further comprises a thixatropic agent.

According to one aspect of the invention, the binder is about 1-10 wt. %.

According to another aspect of the invention, the surfactant is about 1-20 wt. % of organic vehicle. According to another embodiment, the surfactant is about 1-10 wt. % of organic vehicle. According to a further aspect of the invention, the surfactant is at least one of DISPERBYK®-108, DISPERBYK®-116, TEGO® DISPERS 665, or TEGO® DISPERS 662 C. According to another aspect, the surfactant is at least one of hydroxyfunctional carboxylic acid ester with pigment affinic groups, acrylate copolymer with pigment affinic groups, modified polyether with pigment affinic groups or compounds with groups of pigment affinity.

According to a further aspect of the invention, the organic solvent is at least one of carbitol, terpineol, hexyl carbitol, texanol, butyl carbitol, butyl carbitol acetate, or dimethyl adipate.

The invention also provides an electroconductive paste for use in solar cell technology comprising metallic particles, glass frit, and an organic vehicle comprising a binder comprising at least one of PVP, PMMA, or PVB, a surfactant, and an organic solvent.

According to one aspect of the invention, the metallic particles are about 60-90 wt. % of paste. Preferably, the metallic particles are about 80 wt. % of paste. According to another aspect of the invention, the metallic particles are at least one of silver, gold, copper, and nickel.

According to another aspect of the invention, the glass frit is about 1-10 wt. % of paste. Preferably, the glass frit is about 5 wt. %.

According to a further aspect of the invention, wherein the organic vehicle is about 1-20 wt. % of paste. Preferably, the organic vehicle is about 15 wt. % of paste. According to another aspect of the invention, the organic vehicle further comprises a thixatropic agent.

According to another aspect of the invention, the organic vehicle comprises 1-10 wt. % (of organic vehicle) binder.

According to another aspect of the invention, the organic vehicle comprises 1-20 wt. % (of organic vehicle) surfactant. According to another embodiment, the organic vehicle comprises 1-10 wt. % (of organic vehicle) surfactant.

The invention further provides a solar cell produced by applying an electroconductive paste of the invention to a silicon wafer, and firing the silicon wafer.

DETAILED DESCRIPTION

Figure 1A:
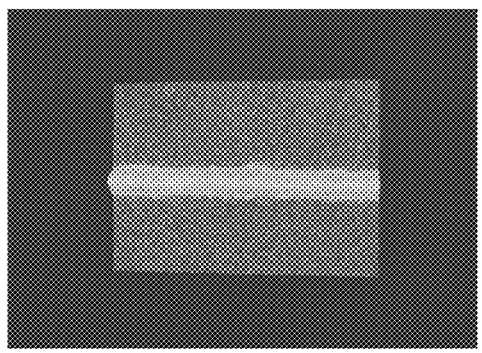
FIG. 1A is a top-view photograph of a dried silver finger line of an exemplary electroconductive paste according to Example 1 printed on a silicon wafer.

The invention teaches an organic vehicle as used in an electroconductive paste. Electroconductive paste compositions typically comprise: metallic particles, glass frit, and an organic vehicle. While not limited to such an application, such pastes may be used to form an electrical contact layer or electrode in a solar cell. Specifically, the pastes may be applied to the front side of a solar cell or to the back side of a solar cell.

One aspect of the invention relates to the composition of the organic vehicle component of the electroconductive paste. A desired organic vehicle is one which is low in viscosity, allowing for fine line printability, and has optimal stability when combined with metallic particles. The organic vehicle is typically comprised of an organic binder, an organic solvent, and a surfactant.

According to one embodiment, an organic vehicle comprises a binder, a surfactant and an organic solvent. The binder comprises at least one of polyvinylpyrrolidone (PVP), polymethylmethacrylate (PMMA), or polyvinyl butyral (PVB).

The preferred embodiment of the organic vehicle consists of about 1-10 wt. % polyvinyl pyrrolidone (PVP) as the organic binder, preferably with molecular weight from 5000 to 5000000 Dalton, about 1-10 wt. % surfactant, about 50-70 wt. % organic solvent. The organic vehicle may include about 1-10 wt. % ethyl cellulose as an additional binder. All weight percents are expressed in weight percent of organic vehicle. The inclusion of PVP enhances the paste's ability to be dispersed uniformly, and it is highly compatible with silver particles. According to another preferred embedment, the surfactant can be any of the following: hydroxyfunctional carboxylic acid ester with pigment affinic groups (including, but not limited to, DISPERBYK®-108, manufactured by BYK USA, Inc.), acrylate copolymer with pigment affinic groups (including, but not limited to, DISPERBYK®-116, manufactured by BYK USA, Inc.), modified polyether with pigment affinic groups (including, but not limited to, TEGO® DISPERS 655, manufactured by Evonik Tego Chemie GmbH), or surfactant with groups of high pigment affinity (including, but not limited to, TEGO® DISPERS 662 C, manufactured by Evonik Tego Chemie GmbH). Further, the organic solvent may be any of carbitol, terpineol, hexyl carbitol, texanol, butyl carbitol, butyl carbitol acetate, or dimethyladipate. The organic vehicle may also comprise a thixatropic agent. Any thixatropic agents familiar to one having ordinary skill in the art may be used with the organic vehicle of the invention. For example, without limitation, thixatropic agents may be derived from natural origin, e.g., castor oil, or they may be synthesized. Commercially available thixatropic agents can also be used with the invention. The organic vehicle according to the preferred embodiment typically exhibits a viscosity range of 140-200 kcPs, and a thixatropic index of 5-10.

Another preferred embodiment of the organic vehicle comprises about 1-10 wt. % polyvinyl pyrrolidone (PVP) as the organic binder, preferably with molecular weight from 5000 to 5000000 Dalton, about 1-20 wt. % surfactant, about 50-70 wt. % organic solvent. The organic vehicle may include about 1-10 wt. % ethyl cellulose as an additional binder. All weight percents are expressed in weight percent of organic vehicle.

Other organic binders also exhibit the desired printability and compatibility for use in electroconductive pastes. The organic vehicle may comprise at least one of polymethylmethacrylate (PMMA) or polyvinyl butyral (PVB) as organic binder. In another embodiment, the organic vehicle comprises about 1-10 wt. % polymethylmethacrylate (PMMA) or polyvinyl butyral (PVB) as the organic binder, as well as about 1-10 wt. % surfactant, about 50-70 wt. % organic solvent, and about 1-10 wt. % ethyl cellulose as additional binder. All weight percents are expressed in weight percent of organic vehicle. The organic vehicle also may comprise a thixatropic agent as known to one skilled in the art.

In yet another embodiment, the organic vehicle comprises about 1-10 wt. % polymethylmethacrylate (PMMA) or polyvinyl butyral (PVB) as the organic binder, as well as about 1-20 wt. % surfactant and about 50-70 wt. % organic solvent. Additionally, the organic vehicle may comprise about 1-10 wt. % ethyl cellulose as additional binder. All weight percents are expressed in weight percent of organic vehicle. The organic vehicle also may comprise a thixatropic agent as known to one skilled in the art.

Another aspect of the invention relates to an electroconductive paste. An electroconductive paste composition comprises about 80 wt. % (of paste) metallic particles, about 5 wt. % (of paste) glass frit, and about 15 wt. % (of paste) organic vehicle. The organic vehicle in the electroconductive paste comprises about 1-10 wt. % (of organic vehicle) binder, about 1-10 wt. % (of organic vehicle) surfactant, and about 50-70 wt. % (of organic vehicle) organic solvent. According to one embodiment, the binder can be any of PVP, PMMA, or PVB. A thixatropic agent, known to one skilled in the art, may also be included in the organic vehicle. The metallic particles are preferably silver, but can be aluminum, gold particles, copper, nickel particles, or other conductive metallic particles known to one skilled in the art, or a combination thereof.

According to another embodiment, the metallic particles make up about 60-90 wt. % of the total paste, and are preferably silver.

The glass frit is about 1-10 wt. % of paste, and may be lead-based or lead-free. The lead-based glass frit comprises lead oxide or other lead-based compounds including, but not limited to, salts of lead halides, lead chalcogenides, lead carbonate, lead sulfate, lead phosphate, lead nitrate and organometallic lead compounds or compounds that can form lead oxides or slats during thermal decomposition. The lead-free glass frit may include other oxides or compounds known to one skilled in the art. For example, silicon, boron, aluminum, bismuth, lithium, sodium, magnesium, zinc, titanium, or zirconium oxides or compounds may be used.

Other glass matrix formers or glass modifiers, such as germanium oxide, vanadium oxide, tungsten oxide, molybdenum oxides, niobium oxides, tin oxides, indium oxides, other alkaline and alkaline earth metal (such as K, Rb, Cs and Be, Ca, Sr, Ba) compounds, rare earth oxides (such as $La_2O_3$, cerium oxides), phosphorus oxides or metal phosphates, transition metal oxides (such as copper oxides and chromium oxides), or metal halides (such as lead fluorides and zinc fluorides) may also be part of the glass composition.

The glass frit may be made by any process known to one skilled in the art. For example, without limitation, by mixing the appropriate amounts of powders of the individual ingredients, heating the powder mixture in air or in an oxygen-containing atmosphere to form a melt, quenching the melt, grinding and ball milling the quenched material and screening the milled material to provide a powder with the desired particle size. For example, glass frit components, in powder form, may be mixed together in a V-comb blender. The mixture may then be heated (e.g., to around 800-1200° C.) for about 30-40 minutes. The glass may then be quenched, taking on a sand-like consistency. This coarse glass powder may then be milled, such as in a ball mill or jet mill, until a fine powder results. Typically, the glass frit may be milled to an average particle size of 0.01-10 µm, preferably 0.1-5 µm.

In another example, conventional solid state synthesis may be used to prepare the glass frits described herein. In this case, raw materials are sealed in a fused-quartz tube or tantalum or platinum tube under vacuum, and then heated to about 700-1200° C. The materials dwell at this elevated temperature for about 12-48 hours and then are slowly cooled (about 0.1° C./minute) to room temperature. In some cases, solid state reactions may be carried out in an alumina crucible in air.

In another example, co-precipitation may be used to form the inorganic reaction systems. In this process, the metal elements are reduced and co-precipitated with other metal oxides or hydroxides to from a solution containing metal cations by adjusting the pH levels or by incorporating reducing agents. The precipitates of these metals, metal oxides or hydroxides are then dried and fired under vacuum at about 400-600° C. to form a fine powder.

The organic vehicle is about 1-20 wt. % of total paste. The organic vehicle itself comprises about 1-10 wt. % binder, about 1-20 wt. % surfactant, and about 50-70 wt. % organic solvent. A thixatropic agent, known to one skilled in the art, may also be included in the organic vehicle.

The electroconductive paste composition may be prepared by any method for preparing a paste composition known in the art or to be developed. The method of preparation is not critical, as long as it results in a homogenously dispersed paste. As an example, without limitation, the paste components may then be mixed, such as with a mixer, then passed through a three roll mill, for example, to make a dispersed uniform paste. It is within the scope of the invention to include the additive in powder form or suspended in a liquid medium. Such a paste may then be utilized to form a solar cell by application of the paste to the antireflection layer on a silicon substrate, such as by screen printing, and then firing to form an electrode (electrical contact) on the silicon substrate.

Example 1

One organic vehicle was prepared by combining 60 wt. % terpineol (or organic solvent), 5 wt. % PVP, 20 wt. % Dispers655, 1-10 wt. % ethyl cellulose, and 5 wt. % thixotrope. The mixture was heated to a temperature of 80° C. while stirring, and then maintained for a total of 30 minutes. The vehicle was then cooled and milled using a three-roll mill until it reached a homogeneous consistency. The vehicle, at up to 20 wt. % (of paste), was then mixed with about 80 wt. % (of paste) silver particles and about 5 wt. % (of paste) glass frit using a speed mixer. The mixture was then milled using a three-roll mill until it became a dispersed uniform paste. The resulting paste was screen printed onto a solar wafer at a speed of 150 mm/s, using screen 325 (mesh)*0.9 (mil, wire diameter)*0.6 (mil, emulsion thickness)*50 μm (finger line opening) (Calendar screen), and the printed wafer was then fired at the appropriate profile.

Example 2

Another organic vehicle was prepared by combining about 60 wt. % terpineol (of organic solvent), 5 wt. % PVP, 20 wt. % BYK662C, 1-10 wt. % ethyl cellulose, and 5 wt. % thixotrope. The mixture was heated to a temperature of 80° C. while stirring, and then maintained for a total of 30 minutes. The vehicle was then cooled and milled using a three-roll mill until it reached a homogenous consistency. The vehicle, at up to 20 wt. % (of paste), was then mixed with about 80 wt. % (of paste) silver particles and about 5 wt. % (of paste) glass frit using a speed mixer. The mixture was then milled using a three-roll mill until it became a dispersed uniform paste. The resulting paste was screen printed onto a solar wafer at a speed of 150 mm/s, using screen 325 (mesh)*0.9 (mil, wire diameter)*0.6 (mil, emulsion thickness)*50 μm (finger line opening) (Calendar screen), and the printed wafer was then fired at the appropriate profile.

Figure 1B:
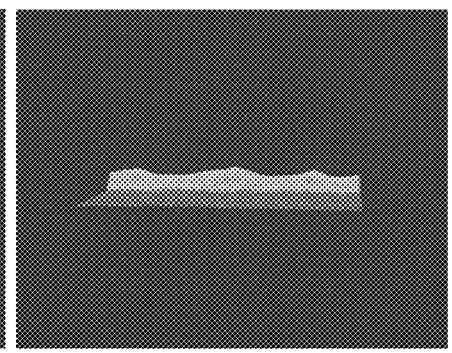
FIG. 1B is an elevation-view photograph of the dried silver finger line as shown in FIG. 1A, taken perpendicular to the line.
Figure 2A:
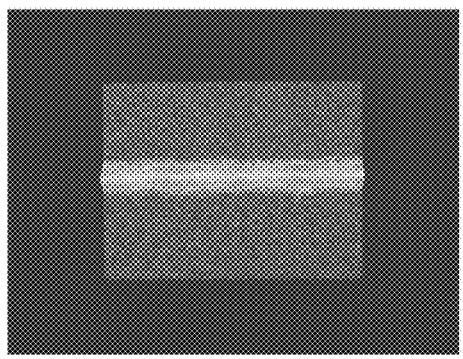
FIG. 2A is a top-view photograph of a fired silver finger line of an exemplary electroconductive paste according to Example 2 printed on a silicon wafer.
Figure 2B:
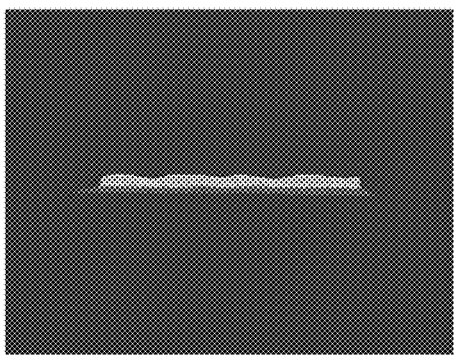
FIG. 2B is an elevation-view photograph of the dried silver finger line as shown in FIG. 2A, taken perpendicular to the line.

FIGS. 1A and 1B show a dried finger line printed using an exemplary paste according to Example 1. The dried line has a width of 77.3 μm, and height of 17.7 μm. The lines are of great longitudinal edge uniformity, and exhibit little variance in height of the finger line, i.e., without peaks and valleys. In FIGS. 2A and 2B, the same finger line, after firing, retains the longitudinal edge and height uniformity. The fired line has a width of 80 μm, and height of 13.0 μm.

The solar cells produced using the exemplary electroconductive pastes were tested using an I-V tester. Xe arc lamp in the I-V tester was used to simulate sunlight with a known intensity and the front surface of the solar cell was irradiated to generate the I-V curve. Using this curve, various parameters common to this measurement method which provide for electrical performance comparison were determined, including NCell (efficiency of solar cell), short circuit current density (Isc), open circuit voltage (Voc), Fill Factor (FF), series resistance (Rs), series resistance under three standard lighting intensities (Rs3), and front grid resistance (GRFr3 or Rfront). All data are compiled in Table 1.

TABLE 1

Electrical Performance of Exemplary Pastes

| Paste | NCell (%) | Isc (mA) | Voc (V) | FF (%) | Rs (Ω) | Rs3 (Ω) | GRFr3 (mΩ) | Rfront (Ω) |
|---|---|---|---|---|---|---|---|---|
| Example 1 | 17.04 | 8.52 | 0.6203 | 78.34 | 0.00498 | 0.00294 | 56.997 | — |
| Example 2 | 16.72 | 8.62 | 0.6178 | 76.44 | 0.00428 | — | — | 0.04079 |

As shown through the results listed in Table 1, the experimental pastes exhibited acceptable series resistance (Rs) and front grid resistance (GRFr3 or Rfront), allowing for better conductivity and overall solar cell efficiency (NCell).

These and other advantages of the invention will be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

What is claimed is:

1. An electroconductive paste for use in solar cell technology comprising:
    about 60-90 wt % of metallic particles comprising silver, based upon total weight of the electroconductive paste;
    about 1-10 wt % glass frit, based upon total weight of the electroconductive paste; and
    about 1-20 wt % of an organic vehicle, based upon total weight of the electroconductive paste, the organic vehicle comprising:
        about 1-10 wt % of a polyvinyl pyrrolidone (PVP) binder, based upon total weight of the organic vehicle,
        about 1-20 wt % of a surfactant, based upon total weight of the organic vehicle,
        about 50-70 wt % of an organic solvent comprising terpineol, based upon total weight of the organic vehicle, and
        about 1-10 wt % ethyl cellulose, based upon total weight of the organic vehicle,
    wherein the electroconductive paste is suitable for screen printing onto a substrate.

2. The electroconductive paste as in claim 1, wherein the metallic particles are about 80 wt. % of the electroconductive paste.

3. The electroconductive paste as in claim 1, wherein the metallic particles further comprise at least one of gold, copper, and nickel.

4. The electroconductive paste as in claim 1, wherein the glass frit is about 5 wt. % of the electroconductive paste.

5. The electroconductive paste as in claim 1, wherein the organic vehicle is about 15 wt. % of the electroconductive paste.

6. The electroconductive paste as in claim 1, wherein the organic vehicle further comprises a thixotropic agent.

7. The electroconductive paste as in claim 1, wherein the organic vehicle comprises 1-10 wt. % surfactant, based upon total weight of the organic vehicle.

* * * * *